(12) United States Patent
Lee

(10) Patent No.: US 12,107,043 B2
(45) Date of Patent: Oct. 1, 2024

(54) MULTILAYER-TYPE ON-CHIP INDUCTOR STRUCTURE

(71) Applicant: VIA LABS, INC., New Taipei (TW)

(72) Inventor: Sheng-Yuan Lee, New Taipei (TW)

(73) Assignee: VIA LABS, INC., New Taipei (TW)

( * ) Notice: Subject to any disclaimer, the term of this patent is extended or adjusted under 35 U.S.C. 154(b) by 115 days.

(21) Appl. No.: 18/165,498

(22) Filed: Feb. 7, 2023

(65) Prior Publication Data

US 2023/0187347 A1 Jun. 15, 2023

Related U.S. Application Data

(62) Division of application No. 17/342,684, filed on Jun. 9, 2021, now Pat. No. 11,605,590.

(30) Foreign Application Priority Data

Jan. 28, 2021 (TW) ................................. 110103222

(51) Int. Cl.
*H01L 23/522* (2006.01)
*H01F 27/28* (2006.01)
*H01L 49/02* (2006.01)

(52) U.S. Cl.
CPC ..... *H01L 23/5227* (2013.01); *H01F 27/2804* (2013.01); *H01L 23/5226* (2013.01); *H01L 28/10* (2013.01); *H01F 2027/2809* (2013.01)

(58) Field of Classification Search
CPC . H01L 23/5227; H01L 23/5226; H01L 28/10; H01L 23/528; H01L 23/5283; H01F 27/2804; H01F 2027/2809; H01F 2017/0073; H01F 17/0013
See application file for complete search history.

(56) References Cited

U.S. PATENT DOCUMENTS

| 8,022,805 | B2 | 9/2011 | Lee |
| 8,081,056 | B2 | 12/2011 | Lee et al. |
| 2009/0115562 | A1* | 5/2009 | Lee ................... H01L 23/5227 336/200 |
| 2013/0140672 | A1* | 6/2013 | Sato ..................... H01F 21/005 257/531 |
| 2018/0123550 | A1 | 5/2018 | Wang et al. |
| 2020/0005980 | A1* | 1/2020 | Dong ..................... H01L 23/12 |

FOREIGN PATENT DOCUMENTS

| CN | 1889205 | 1/2007 |
| CN | 2914270 | 6/2007 |
| CN | 2914270 Y | 6/2007 |
| TW | 200917289 | 4/2009 |
| TW | 200921720 | 5/2009 |

* cited by examiner

*Primary Examiner* — Mohammed R Alam
(74) *Attorney, Agent, or Firm* — McClure, Qualey & Rodack, LLP

(57) ABSTRACT

A multilayer-type on-chip inductor with a conductive structure includes an insulating redistribution layer disposed on an inter-metal dielectric layer, a first spiral trace layer disposed in the insulating redistribution layer, and a second spiral trace layer disposed in the inter-metal dielectric layer correspondingly formed below the first spiral trace layer, wherein the inter-metal dielectric layer has a separating region to divide the second spiral trace layer into a plurality of line segments, and wherein each of a plurality of first slit openings and each of a plurality of second slit openings pass through a corresponding line segment, and extend in an extending direction of a length of the corresponding line segment.

10 Claims, 13 Drawing Sheets

MULTILAYER-TYPE ON-CHIP INDUCTOR STRUCTURE

CROSS REFERENCE TO RELATED APPLICATIONS

This application claims priority of Taiwan Patent Application No. 110103222, filed on Jan. 28, 2021, the entirety of which is incorporated by reference herein.

This application is related to the following co-pending commonly assigned patent application: U.S. Ser. No. 17/342,699, filed on Jun. 9, 2021, and entitled "MULTILAYER-TYPE ON-CHIP INDUCTOR STRUCTURE", the entirety of which is incorporated by reference herein.

BACKGROUND OF THE INVENTION

Field of the Invention

The invention relates to a semiconductor structure, and in particular to a vertically stacked multilayer-type on-chip inductor structure.

Description of the Related Art

Many digital/analog devices and circuits have been successfully applied to semiconductor integrated circuits. Such devices may include passive components, such as resistors, capacitors, or inductors. Typically, a semiconductor integrated circuit includes a silicon substrate. One or more dielectric layers are disposed on the substrate, with one or more metal layers disposed in the dielectric layers. The metal layers may be employed to form on-chip elements, such as on-chip inductors, by current semiconductor technologies.

With the rapid development of communication systems, a system on chip (SOC) typically includes radio frequency (RF) circuits and digital or baseband circuits. Since the RF circuits in a design rule of an SOC includes thick traces with relatively higher manufacturing cost, the chip design for fabrication typically employs a digital or baseband circuit process with relatively lower manufacturing cost. However, compared to the RF circuits in a design rule of an SOC, digital or baseband circuits in a design rule of an SOC employ thinner inductor traces, resulting reduced quality factor (Q value).

Since the performance of integrated circuit devices is based on the Q value of the on-chip inductors, there is a need to develop an on-chip inductor structure with increased Q value

BRIEF SUMMARY OF THE INVENTION

In some embodiments, a multilayer-type on-chip inductor structure is provided. The multilayer-type on-chip inductor structure includes an insulating redistribution layer disposed on an inter-metal dielectric layer, a first spiral trace layer disposed in the insulating redistribution layer, and a second spiral trace layer disposed in the inter-metal dielectric layer and correspondingly formed below the first spiral trace layer. The inter-metal dielectric layer has a separating region to divide the second spiral trace layer into line segments. First slit openings each passes through a corresponding line segment, and extends in an extending direction of a length of the corresponding line segment.

In some embodiments, a multilayer-type on-chip inductor structure is provided. The multilayer-type on-chip inductor structure includes an insulating redistribution layer disposed on an inter-metal dielectric layer, a first spiral trace layer disposed in the insulating redistribution layer, and a second spiral trace layer disposed in the inter-metal dielectric layer and correspondingly formed below the first spiral trace layer. The inter-metal dielectric layer has a separating region to divide the second spiral trace layer into a plurality of line segments. Each of first slit openings and each of second slit openings pass through a corresponding line segment, and extend in an extending direction of a length of the corresponding line segment.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. In addition, the present disclosure may repeat reference numbers and/or letters in the various embodiments. This repetition is for the purpose of simplicity and clarity, and does not imply any relationship between the different embodiments and/or configurations discussed.

Figure 1:
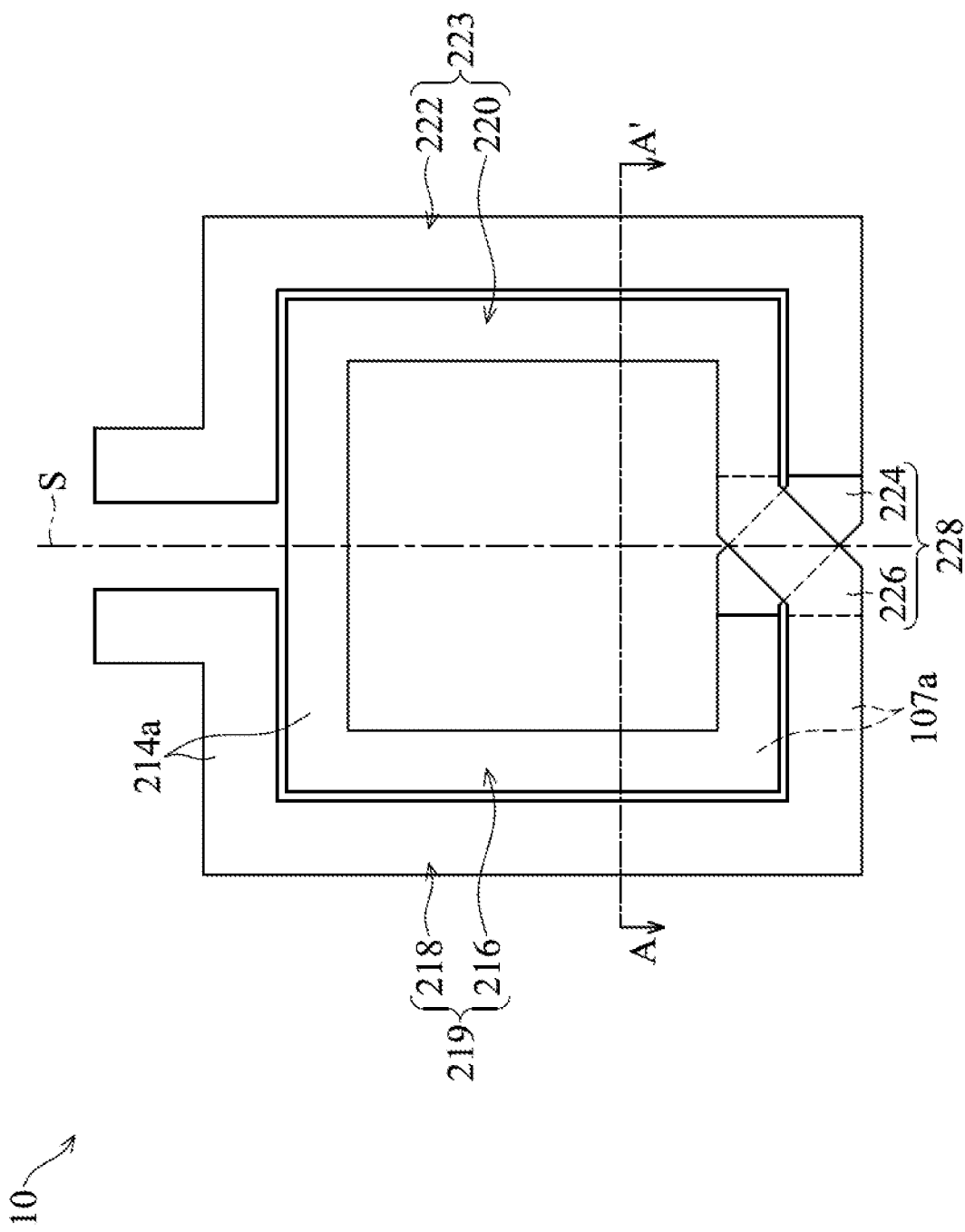
FIG. 1 is a plan view of a multilayer-type on-chip inductor structure in accordance with some embodiments.
Figure 2:
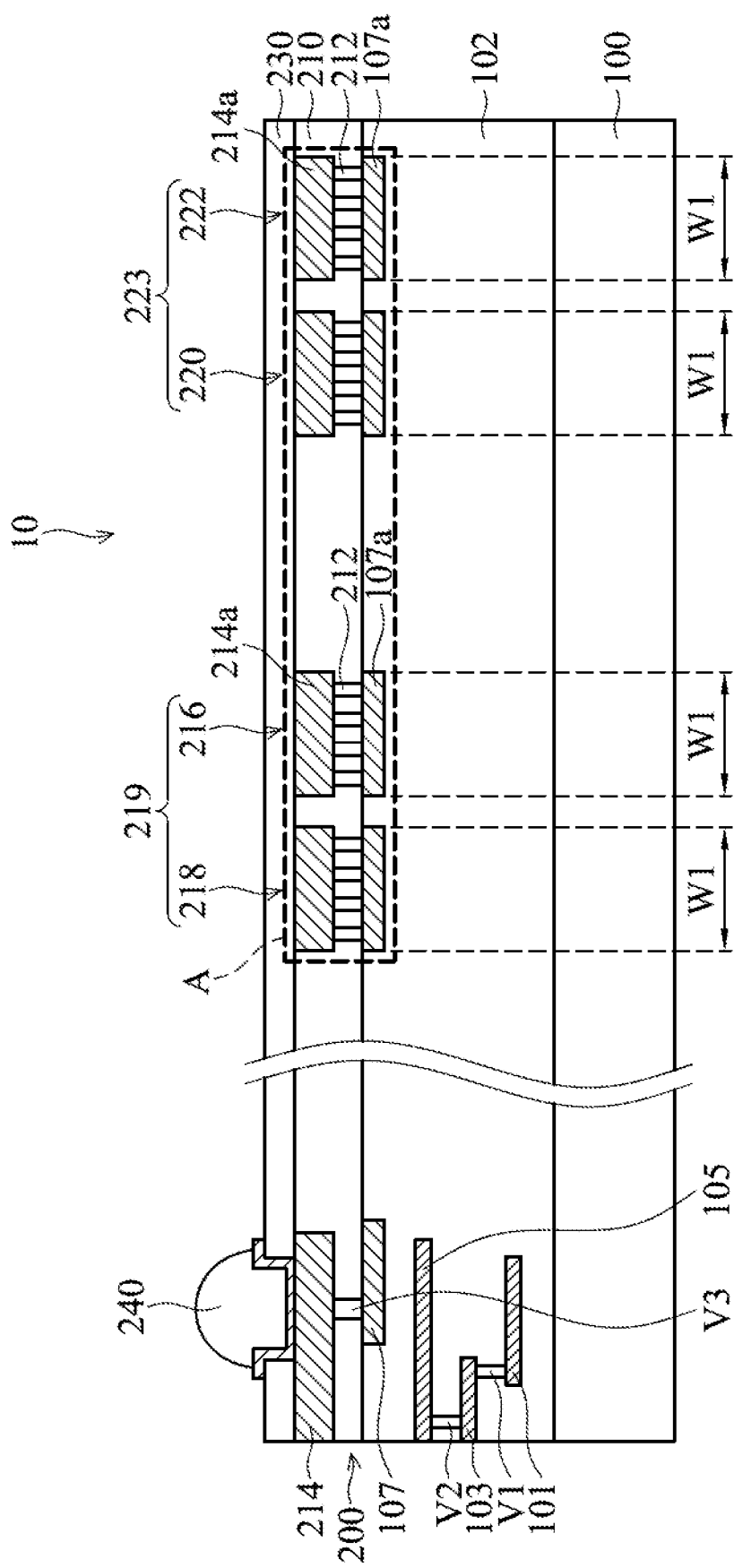
FIG. 2 shows a cross section of a semiconductor circuit with a multilayer-type on-chip inductor structure shown in FIG. 1 in accordance with some embodiments.

Refer to FIGS. 1 and 2, in which FIG. 1 illustrates a plan view of a multilayer-type on-chip inductor structure 10 in accordance with some embodiments, and FIG. 2 illustrates a cross section of a semiconductor circuit with a multilayer-type on-chip inductor structure 10 shown in FIG. 1 in accordance with some embodiments. The region A (indicated by dashed line) in FIG. 2 shows a cross section along A-A' line shown in FIG. 1. In some embodiments, the semiconductor circuit includes a substrate 100, an inter-metal dielectric (IMD) layer 102 disposed on the substrate 100, an insulating redistribution layer 210 disposed on the inter-metal dielectric layer 102, vertical and horizontal conductive features and multilayer-type on-chip inductor structure 10 disposed in the inter-metal dielectric layer 102 and the insulating redistribution layer 210, a passivation layer 230 covering the insulating redistribution layer 210, and connectors 240 (e.g., solder bumps or solder balls) disposed in the passivation layer 230, as shown in FIG. 2.

In some embodiments, the substrate 100 includes a silicon substrate or other well-known semiconductor material substrate. The substrate 100 may include various elements, such as transistors, resistors, capacitors, and other well-known semiconductor elements. Moreover, substrate 100 may also include other conductive layers (e.g., copper, aluminum, or alloys thereof) and one or more insulating layers (e.g., silicon oxide layers, silicon nitride layers, or low-k dielectric material layer). Herein, in order to simplify the diagram, only a flat substrate is depicted.

In some embodiments, the inter-metal dielectric layer 102 can be a single dielectric material layer or a multi-layer dielectric structure. For example, the inter-metal dielectric layer 102 may include multiple dielectric material layers formed on the substrate 100 in an alternating manner with the horizontal conductive features (e.g., wiring layers 101, 103, 105, and 107). Herein, in order to simplify the diagram, only a flat substrate is depicted to represent the inter-metal dielectric layer 102. The wiring layers 101, 103, 105 and 107 are electrically connected to each other by the vertical conductive features (e.g., conductive plug V1 and V2) and form an interconnect structure with the inter-metal dielectric layer 102, so as to electrically connect various different elements in the substrate 100. In some embodiments, the inter-metal dielectric layer 102 includes a silicon oxide layer, a silicon nitride layer, a low-k dielectric material layer, or another suitable dielectric material layer. Moreover, the wiring layers 101, 103, 105 and 107 include copper.

In some embodiments, the insulating redistribution layer 210 may be a single dielectric material layer or a multi-layer dielectric structure. For example, the insulating redistribution layer 210 may include a single dielectric material layer having a redistribution layer 214 and at least one conductive plug V3 therein, so as to form a redistribution structure 200. The connectors 240 are electrically connected to the interconnect structure by the insulating the redistribution layer 214 and the conductive plug V3 in the redistribution layer 210, so that the elements in the substrate 10 are electrically connected to the connectors 240. In some embodiments, the insulating redistribution layer 210 includes an inorganic dielectric layer (e.g., a silicon oxide layer, a silicon nitride layer, or a low-k dielectric material layer), an organic dielectric layer (e.g., a polyimide (PI) layer), or another suitable dielectric material layer. In some embodiments, the redistribution layer 214 includes aluminum.

In some embodiments, the multilayer-type on-chip inductor structure 10 includes an inter-metal dielectric layer 102, an insulating redistribution layer 210 disposed on the inter-metal dielectric layer 102, and a first winding portion 219 and a second winding portion 223 disposed in the inter-metal dielectric layer 102 and the insulating redistribution layer 210, as shown in FIG. 2. In some embodiments, the first winding portion 219 and the second winding portion 223 are symmetrically arranged to each other with respect to a symmetrical axis S (indicated by a dashed line), as shown in FIG. 1. For example, the first winding portion 219 is disposed on the first side of the symmetric axis S, and the second winding portion 223 is disposed on the second side of the symmetric axis S.

In some embodiments, the first winding portion 219, disposed on the first side of the symmetric axis S, includes at least two semi-circular stacking layers arranged concentrically from the inside to the outside. Further, the second winding portion 223, disposed on the second side of the symmetric axis S, includes at least two semi-circular stacking layers arranged concentrically from the inside to the outside. For example, the first winding portion 219 includes at least a first semi-circular stacking layer 216 and a second semi-circular stacking layer 218 arranged from the inside to the outside and in concentricity. The second winding portion 223 includes at least a first semi-circular stacking layer 220 and a second semi-circular stacking layer 222 arranged from the inside to the outside and in concentricity. It is appreciated that although the first and second winding portions respectively having two semi-circular stacking layers are illustrated as examples, the embodiments of the present disclosure may also be applied on the winding portion having more than two semi-circular stacking layers, and not limited to the exemplary embodiments shown in FIGS. 1 and 2. In some embodiments, the first winding portion 219 and the second winding portion 223 substantially form a circular, rectangular, hexagonal, octagonal, or polygonal shape. To simplify the diagram, only an exemplary rectangular shape is depicted.

In some embodiments, the first semi-circular stacking layers 216 and 220 and the second semi-circular stacking layers 218 and 222 can be formed of the horizontal and vertical conductive features in the inter-metal dielectric layer 102 and the insulating redistribution layer 210. More specifically, each of the first semi-circular stacking layers 216 and 220 and the second semi-circular stacking layers 218 and 222 has a first trace layer 214a (i.e., the horizontal conductive feature), a second trace layer 107a (i.e., the horizontal conductive feature), and conductive plugs 212 (i.e., vertical conductive features) formed between the first trace layer 214a and the second trace layer 107a. In the first semi-circular stacking layers 216 and 220 and the second semi-circular stacking layers 218 and 222, the first trace layer 214a is electrically connected to the corresponding second trace layer 107a via the conductive plugs 212. In some embodiments, the first semi-circular stacking layers 216 and 220 and the second semi-circular stacking layers 218 and 222 have the same line width and line space.

In some embodiments, the first trace layer 214a is disposed in the insulating redistribution layer 210 and located at the same level as that of the redistribution layer 214 in the insulating redistribution layer 210. For example, the first trace layer 214a and the redistribution layer 214 may be defined by the same uppermost metal layer in redistribution structure 200.

The second trace layer 107a is disposed in the inter-metal dielectric layer 102 and correspondingly formed below the first trace layer 214a. The second trace layer 107a and the wiring layer 107 are located at the same level of the inter-metal dielectric layer 102. For example, the second trace layer 107a and the wiring layer 107 can be defined by the same uppermost metal layer (i.e., the uppermost horizontal conductive feature) in the interconnect structure. The interconnect structure is different from the redistribution structure 200.

In some embodiments, the first semi-circular stacking layers 216 and 220 and the second semi-circular stacking layers 218 and 222 may be made of metal, for example, copper, aluminum, alloys thereof, or other suitable metal materials.

For a general design rule, the thickness of the redistribution layer 214 is greater than the uppermost metal layer (e.g., the wiring layer 107) in the interconnect structure. The thickness of the uppermost metal layer (e.g., the wiring layer 107) in the interconnect structure is greater than or equal to that of the underlying metal layers (e.g., the wiring layers 101, 103, and 105), depending on the various requirements. Therefore, the first trace layer 214a defined by the uppermost metal layer in the redistribution structure 200 and the second trace layer 107a defined by the uppermost metal layer in the interconnect structure can increase the cross section of the inductor significantly. Herein, the term "cross section" refers to an area of the semi-circular stacking layer perpendicular to the current direction in the inductor. As a result, compared to inductors formed by one or more metal layers in the interconnect structure, the multilayer-type on-chip inductor structure 10 can reduce the conductor loss of the winding portion due to the thicker first trace layer, thereby improving the Q value of the inductor. In particular, in the general design rule, if an on-chip inductor is to be formed in an region of the chip, the on-chip inductor is formed by the uppermost metal layer or the underlying metal layers in the interconnect structure, and only the insulating redistribution layer 210 covering the on-chip inductor. That is, other elements at the redistribution layer 214 (the metal layer or the metal trace layer) would not be designed above the on-chip inductor, so as to prevent the signals of the other elements at the redistribution layer from affecting the performance of the on-chip inductor. The embodiments uses the space in the insulating redistribution layer 210 above the on-chip inductor to arrange a metal trace layer (e.g., the first trace layer 214a defined together with the redistribution layer 214), and uses such a metal trace layer as a portion of the on-chip inductor. As a result, the first trace layer 214a with a thicker thickness can increase the "cross section" of the inductor and improves the performance of the inductor.

In some embodiments, in order to further increase the cross section of the inductor, the width W1 of the second trace layer 107a can be designed as the maximum admissible width of the design rule for the interconnect structure. In those cases, although the first trace layer 214a has a wider maximum admissible width of the design rule for the redistribution structure than the width W1 of the second trace layer 107a, the width of the first trace layer 214a is limited to the maximum admissible width of the second trace layer 107a in order to match the maximum admissible width of the second trace layer 107a. Namely, the width of the first trace layer 214a would be designed to be substantially equal to the width W1 of the second trace layer 107a. For example, it is assumed that the maximum allowable width of the first trace layer 214a is about 35 microns (μm) and the maximum allowable width of the second trace layer 107a is about 12 microns (μm). In this case, the width of the first wiring layer 214a can only match the maximum allowable width of the second wiring layer 107a, and is about 12 microns (μm).

In some embodiments, the multilayer-type on-chip inductor structure 10 further includes a connecting layer pair 228 disposed between the first winding portion 219 and the second winding portion 223. The connecting layer pair 228 electrically connects the first semi-circular stacking layer 216 of the first winding portion 219 to the corresponding second semi-circular stacking layer 222 of the second winding portion 223, and electrically connects the second semi-circular stacking layer 218 of the winding portion 219 and the corresponding first semi-circular stacking layer 220 of the second winding portion 223. In some embodiments, the connecting layer pair 228 includes a lower cross-connection layer 224 and an upper cross-connection layer 226. The upper cross-connection layer 226 connects the first trace layer 214a of the second semi-circular stacking layer 218 of the first winding portion 219 to the first trace layer 214a of the first semi-circular stacking layer 220 of the second winding portion 223. The lower cross-connection layer 224 connects the second trace layer 107a of the first semi-circular stacking layer 216 of the first winding portion 219 to the second trace layer 107a of the second semi-circular stacking layer 222 of the second winding portion 223.

In some embodiments, the upper cross-connection layer 226 and first trace layer 214a are located at the same level of the insulating redistribution layer 210. That is, the upper cross-connection layer 226 can be defined by the uppermost metal layer in the redistribution structure 200. In some embodiments, the lower cross-connection layer 224 is located below the upper cross-connection layer 226 and at the same level of the inter-metal dielectric layer 102 as that of the second trace layer 107a. That is, the lower cross-connection layer 224 can be defined by the uppermost metal layer in the interconnect structure. In some embodiments, the lower cross-connection layer 224 and the upper cross-connection layer 226 are made of metals, such as copper, aluminum, alloys thereof, or other suitable metallic materials.

Figure 3:
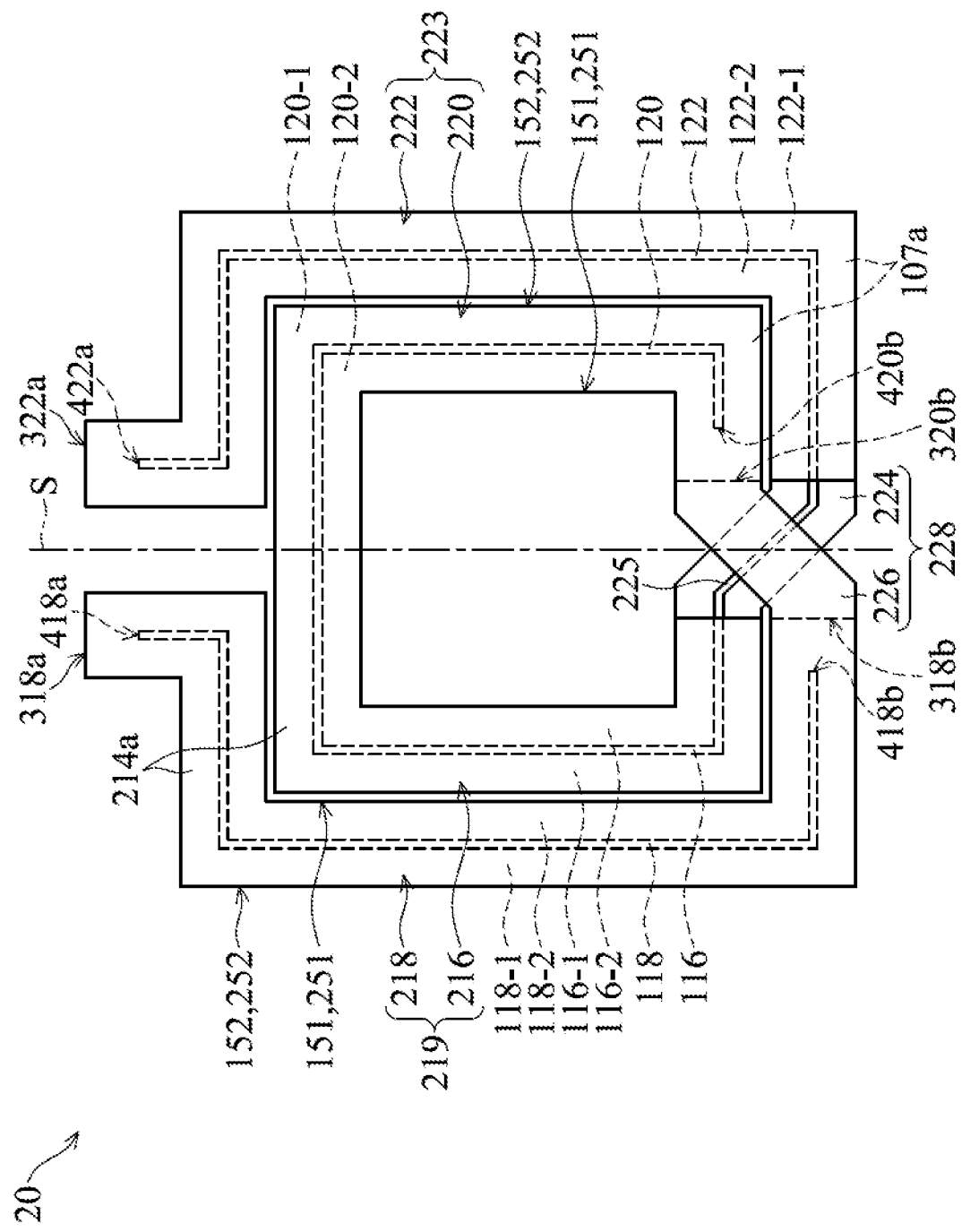
FIG. 3 is a plan view of a multilayer-type on-chip inductor structure in accordance with some embodiments.
Figure 4A:
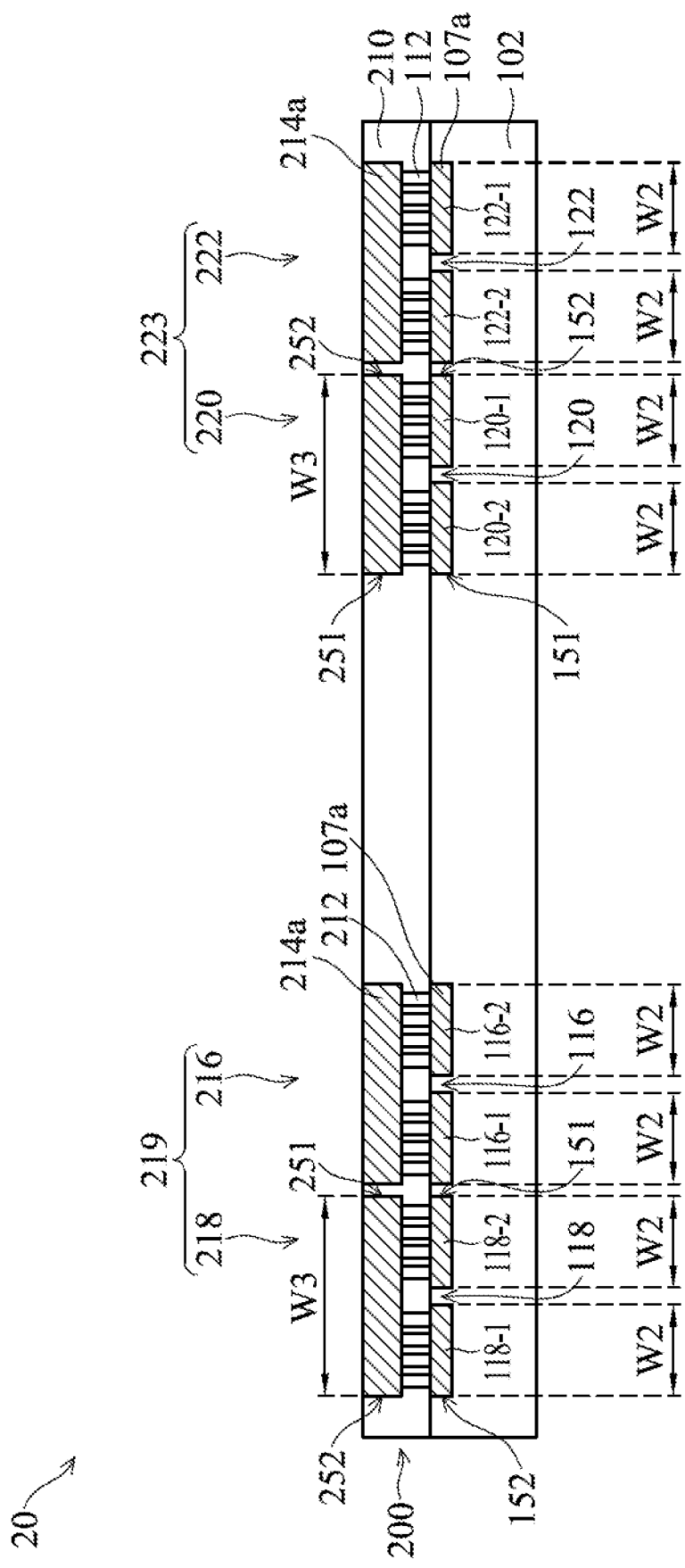
FIG. 4A shows a cross section of a multilayer-type on-chip inductor structure shown in FIG. 3 in accordance with some embodiments.

Refer to FIGS. 3 and 4A, in which FIG. 3 is a plan view of a multilayer-type on-chip inductor structure 20 according to some embodiments, and FIG. 4A is a schematic drawing of a multilayer-type on-chip inductor structure 20 according to FIG. 3 of some embodiments of the present invention. The FIG. 4A shows the cross-sectional view of the multilayer-type on-chip inductor structure 20 shown in FIG. 3 according to some embodiments. Elements in FIGS. 3 and 4A that are the same as those in FIGS. 1 and 2 are labeled with the same reference numbers as in FIGS. 1 and 2 and are not described again. The multilayer-type on-chip inductor structure 20 has a structure similar to the multilayer-type on-chip inductor structure 10 in FIGS. 1 and 2.

However, unlike the multilayer-type on-chip inductor structure 10 in FIGS. 1 and 2, the multilayer-type on-chip inductor structure 20 has a slit opening in the second trace layer 107a. More specifically, the first semi-circular stacking layer 216 has a slit opening 116, and the second trace layer 107a of the second semi-circular stacking layer 218 has a slit opening 118. Also, the second trace layer 107a of the first semi-circular stacking layer 220 has a slit opening 120, and the second trace layer 107a of the second semi-circular stacking layer 222 has a slit opening 122. In some embodiments, these slit openings 116, 118, 120, and 122 vertically pass through the corresponding second trace layer 107a and extend in the extending direction of the length of the corresponding second trace layer 107a. For example, since the first winding portion 219 and the second winding portion 223 constitute a substantially rectangular shape, these slit openings 116, 118, 120, and 122 also constitute a substantially rectangular shape.

In some embodiments, the second trace layer 107a of the first semi-circular stacking layer 216 forms two line portions separated by the slit opening 116, and the second semi-circular stacking layer 218 forms two separated line portions due to the slit opening 118, as shown in FIG. 4A. Also, the second trace layer 107a of the first semi-circular stacking layer 220 forms two line portions due to the slit opening 120, while the second trace layer 107a of the second semi-circular stacking layer 222 forms two line portions due to the slit opening 120, as shown in FIG. 4A.

As shown in FIG. 3, in some embodiments, the second trace layer 107a of the second semi-circular stacking layer 218 of the first winding portion 219 has a first end 318a and a second end 318b. Moreover, the first end 318a is spaced apart from a corresponding first end 418a of the slit opening 118 by a distance, and the second end 318b is also spaced apart from a corresponding second end 418b of the slit opening 118 by a distance. As a result, the two line portions separated on both sides of the slit opening 118 are joined at the first end 418a and the second end 418b. Herein, the first end and the second end of the semi-circular stacking layer are used for illustrating two difference ends, and do not limit the direction and position of the ends.

In some embodiments, an end 322a (e.g., an end that is not connected to the lower cross-connection layer 224) of the second semi-circular stacking layer 222 of the second winding portion 223 is spaced apart from a corresponding end 422a of the slit opening 122 by a distance. As a result, the two separated line portions on both sides of the slit opening 122 are joined to each other at end 422a. Similarly, an end 320b of the second trace layer 107a of the first semi-circular stacking layer 220 of the second winding portion 223 is spaced apart from a corresponding end 420b of the slit opening 120 by a distance. As a result, the two separated line portions on both sides of the slit opening 120 are joined to each other at the end 420b.

The first trace layer 214a in each of the first semi-circular stacking layers 216 and 220 and the second semi-circular stacking layers 218 and 222 has an inner edge 251 and an outer edge 252. The second trace layer 107a in each of the first semi-circular stacking layers 216 and 220 and the second semi-circular stacking layers 218 and 222 also has an inner edge 151 and an outer edge 152. In some embodiments, the inner edge 251 of the first trace layer 214a is substantially aligned to the inner edge 151 of the second trace layer 107a, and the outer edge 252 of the first trace layer 214a is substantially aligned to the inner edge 151 of the second trace layer 107a. In those cases, the separated line portions 116-1 and 116-2 on both sides of the slit opening 116, the separated line portions 118-1 and 118-2 on both sides of the slit opening 118, and the separated line portions 120-1, 120-2 on both sides of slit opening 120, and the separated line portions 122-1, 122-2 on both sides of the slit opening 122 each has a width W2. In some embodiments, although the width W2 of the line portions 116-1 to 122-2 each still needs to satisfy the maximum allowable width of the design rule of the interconnect structure, the width W3 of the first trace layer 214a can be the sum of the widths W2 of the two line portions (e.g., the line portions 116-1 and 116-2) below the corresponding trace layer 214a and the width of the corresponding slit opening (e.g., the slit opening 116), as long as this sum is not greater than the maximum allowable width of the first trace layer 214a. For example, it is assumed that the maximum allowable width of the first trace layer 214a is about 35 micrometers (μm), the maximum width of the first trace layer 214a in FIG. 4A can be designed to be about 35 micrometers (μm). However, as previously described, the width of the first trace layer 214a in FIG. 2 is limited to the maximum allowable width of the second trace layer 107a (e.g., 12 microns (μm)). That is, under the same design rule, the cross section of the first trace layer 214a in the embodiment of FIG. 4A is greater than the cross section of the first trace layer 214a in the embodiment of FIG. 2, so as to provide a larger cross section for the inductor. In other words, the width of the second trace layer 107a having slit openings 116, 118, 120, and 122, and the corresponding line portions 116-1, 116-2, 118-1, 118-2, 120-1, 120-2, 122-1, and 122-2 (i.e., the distance between the width of the inner edge 151 and outer edge 152) can be designed to be greater than the width W1 of the second trace layer 107a shown in FIG. 2 (i.e., greater than the maximum allowable width of the design rule of the interconnect structure). Since the inner edge 251 and the outer edge 252 of the first trace layer 214a are respectively aligned to the inner edge 151 and the outer edge 152 of the second trace layer 107a, the width W3 of the first trace layer 214a (i.e., the distance between the inner edge 251 and the outer edge 252) is also greater than the width W1 of the second trace layer 107a shown in FIG. 2.

Therefore, compared with the multilayer-type on-chip inductor structure 10 shown in FIGS. 1 and 2, the multilayer-type on-chip inductor structure 20 can further increase the cross section of the inductor to further improve the Q value of the inductor.

Moreover, unlike the multilayer-type on-chip inductor structure 10 in FIGS. 1 and 2, the lower cross-connection layer 224 of the connecting layer pair 228 in the multilayer-type on-chip inductor structure 20 has a slit opening 225. In some embodiments, the slit opening 225 vertically passes through the lower cross-connection layer 224 and extends in the extending direction of the length of the lower cross-connection layer 224, as shown in FIG. 3. Moreover, the slit opening 225 is aligned to and connected to the slit opening 116 in the second trace layer 107a of the first semi-circular stacking layer 216 and the slit opening 116 in the second trace layer 107a of the second semi-circular stacking layer 222.

Figure 4B:
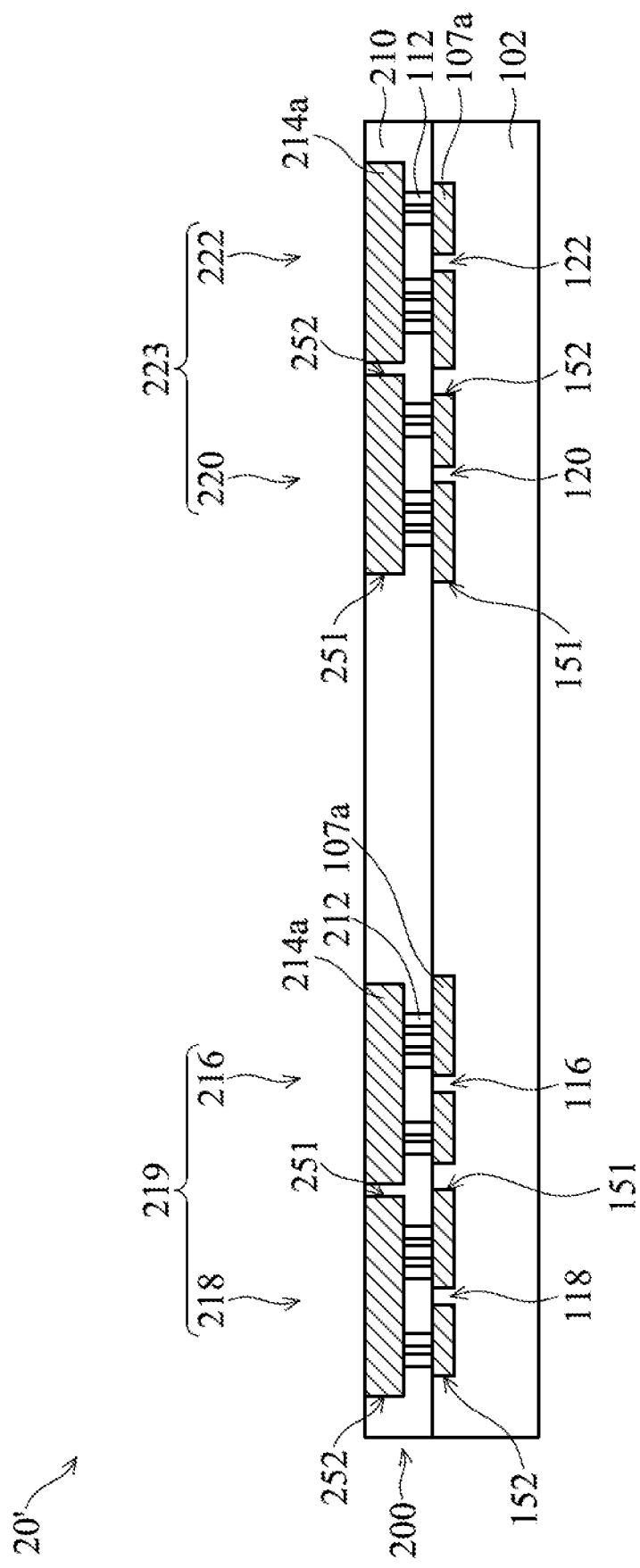
FIG. 4B is a cross section of a multilayer-type on-chip inductor structure in accordance with some embodiments.

Refer to FIG. 4B, which illustrates a cross section of a multilayer-type on-chip inductor structure 20' in accordance with some embodiments. Elements in FIG. 4B that are the same as those in FIG. 4A are labeled with the same reference numbers as in FIG. 4A and are not described again. The structure of the multilayer-type on-chip inductor structure 20' is similar to the structure of multilayer-type on-chip inductor structure 20 shown in FIG. 4A. The difference is that in the multilayer-type on-chip inductor structure 20', the inner edge 251 of the first trace layer 214a is not aligned to the inner edge 151 of the second trace layer 107a, and the outer edge 252 of the first trace layer 214a is not aligned to the outer edge 152 of the second trace layer 107a.

In some embodiments, the inner edge 151 of the second trace layer 107a laterally protrudes from the inner edge 251 of the corresponding first trace layer 214a. Moreover, the outer edge 252 of the corresponding first trace layer 214a laterally protrudes from the outer edge 152 of the second trace layer 107a, as shown in FIG. 4B. Alternatively, in an embodiment (not shown), the outer edge 152 of the second trace layer 107a laterally protrudes from the outer edge 252 of the corresponding first trace layer 214a. Moreover, the inner edge 251 of the corresponding first trace layer 214a laterally protrudes from the inner edge 151 of the second trace layer 107a.

In some other embodiments (not shown), the outer edge 152 and the inner edge 151 of the second trace layer 107a protrude laterally from the corresponding outer edge 252 and inner edge 251 of the first trace layer 214a, respectively. Alternatively, the outer edge 252 and the inner edge 251 of the corresponding first trace layer 214a protrude laterally from the outer edge 152 and the inner edge 151 of the second trace layer 107a, respectively.

Figure 5:
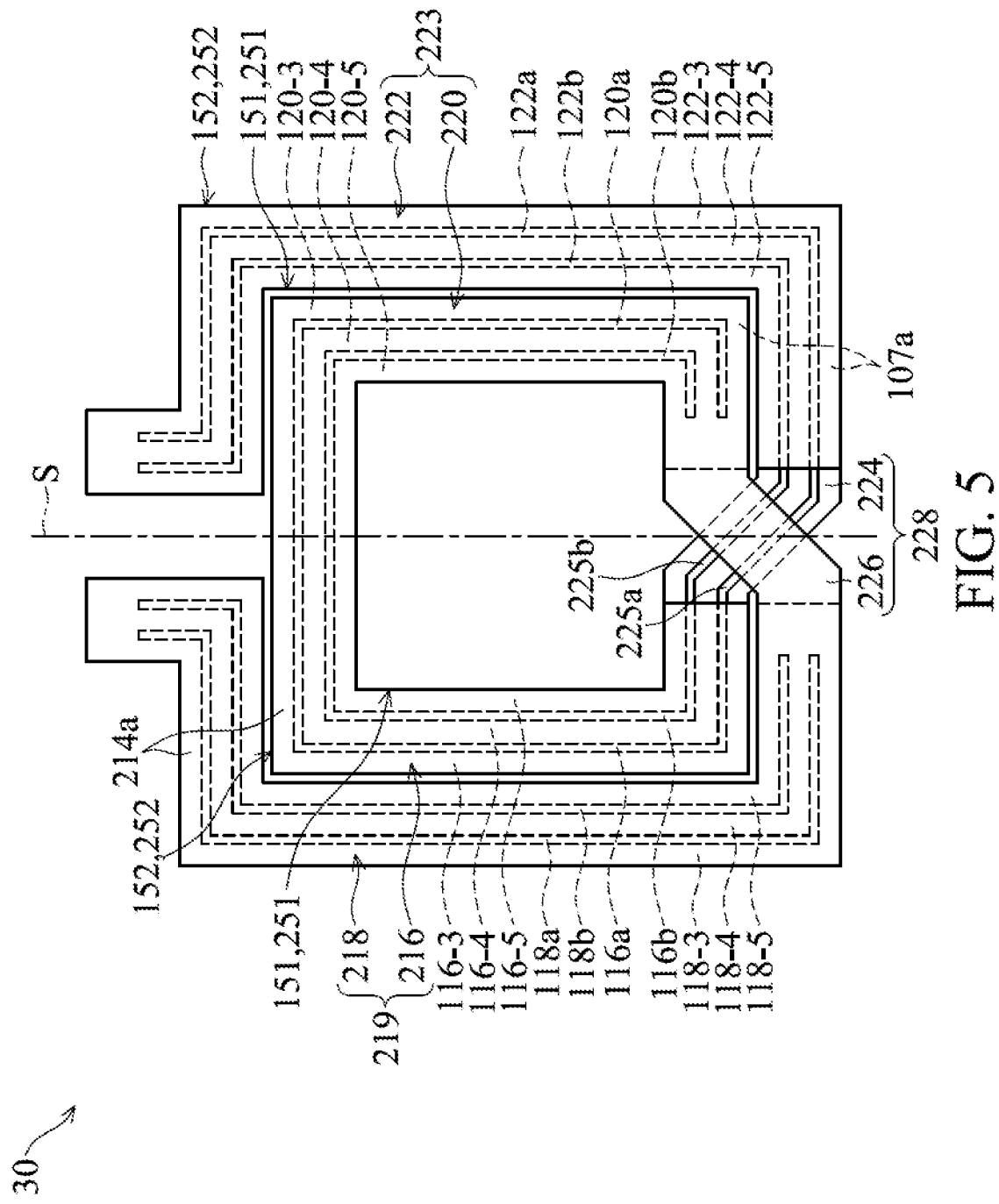
FIG. 5 is a plan view of a multilayer-type on-chip inductor structure in accordance with some embodiments.
Figure 6:
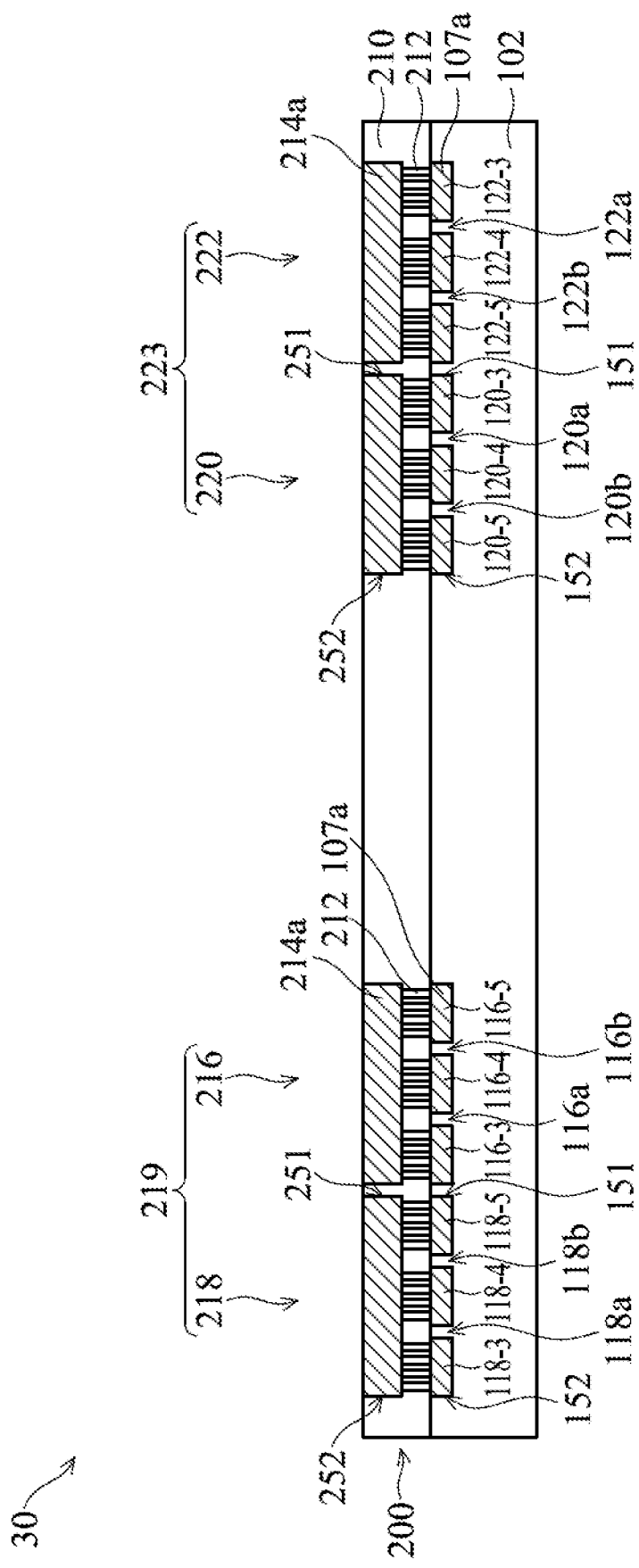
FIG. 6 shows a cross section of a multilayer-type on-chip inductor structure shown in FIG. 5 in accordance with some embodiments.

Refer to FIGS. 5 and 6, in which FIG. 5 is a plan view of a multilayer-type on-chip inductor structure 30 in accordance with some embodiments, and FIG. 6 a cross section of a multilayer-type on-chip inductor structure 30 shown in FIG. 5 in accordance with some embodiments. Elements in FIGS. 5 and 6 that are the same as those in FIGS. 3 and 4A are labeled with the same reference numbers as in FIGS. 3 and 4A and are not described again. The multilayer-type on-chip inductor structure 30 has a structure that is similar to that of the multilayer-type on-chip inductor structure 20 shown in FIGS. 3 and 4A.

However, unlike the multilayer-type on-chip inductor structure 20 shown in FIGS. 3 and 4A, the second trace layer 107a in the multilayer-type on-chip inductor structure 30 has more than one slit openings with a side-by-side arrangement. In some embodiments, the second trace layer 107a of the first semi-circular stacking layer 216 has two slit openings 116a and 116b with a side-by-side arrangement, and the second trace layer 107a of the second semi-circular stacking layer 218 has two slit openings 118a and 118b with a side-by-side arrangement. Also, the second trace layer 107a of the first semi-circular stacking layer 220 has two slit openings 120a and 120b with a side-by-side arrangement, and the second trace layer 107a of the second semi-circular stacking layer 222 has two slit openings 122a and 122b with a side-by-side arrangement. In some embodiments, these slit openings 116a, 116b, 118a, 118b, 120a, 120b, 122a, and 122b vertically pass through the corresponding second trace layer 107a. The slit opening 116b extends in the extending direction of the length of the slit opening 116a, and the slit opening 118b extends in the extending direction of the length of the slit opening 118a. Also, the slit opening 120b extends in the extending direction of the length of the slit opening 120a, and the slit opening 122b extends in the extending direction of the length of the slit opening 122a.

As shown in FIGS. 5 and 6, in some embodiments, the second trace layer 107a of the first semi-circular stacking layer 216 has three line portions 116-3, 116-4, and 116-5 separated from each other due to the slit openings 116a and 116b. Similarly, the second trace layer 107a of the second semi-circular stacking layer 218 has three line portions 118-3, 118-4, and 118-5 separated from each other due to the slit openings 118a and 118b. The second trace layer 107a of the first semi-circular stacking layer 220 has three line portions 120-3, 120-4, and 120-5 separated from each other due to the slit openings 120a and 120b. The second trace layer 107a of the second semi-circular stacking layer 222 has three line portions 122-3, 122-4, and 122-5 separated from each other due to the slit openings 122a and 122b.

In some embodiments, similar to the arrangement of the slit openings 116, 118, 120, and 122 shown in FIG. 3, the two ends of the second trace layer 107a of the second semi-circular stacking layer 218 of the first winding portion 219 (i.e., the three line portions 118-3, 118-4, and 118-5) are spaced apart from the corresponding two ends of the slit opening 118a by a distance, and spaced apart from the corresponding two ends of the slit opening 118b by this distance. Moreover, one end (an end that is not connected to the lower cross-connection layer 224) of the second trace layer 107a of the second semi-circular stacking layer 222 of the second winding portion 223 (i.e., the three line portions 122-3, 122-4, and 122-5) is spaced apart from a corresponding end of the slit opening 122a by a distance, and spaced apart from a corresponding end of slit opening 122b by this distance. In addition, one end of the second trace layer 107a of the first semi-circular stacking layer 220 of the second winding portion 223 (i.e., the three line portions 120-3, 120-4, and 120-5) is spaced apart from a corresponding end of the slit opening 120b by this distance.

Similar to the multilayer-type on-chip inductor structure 20 shown in FIGS. 3 and 4A, although the width of the line portions 116-3 to 116-5, 118-3 to 118-5, 120-3 to 120-5, and 122-3 to 122-5 each still needs to satisfy the maximum allowable width of the design rule of the interconnection structure, the width of the first trace layer 214a shown in FIGS. 5 and 6 can be the sum of the widths of the three line portions (e.g., the line portions 116-3, 116-4, and 116-5) below the corresponding trace layer 214a and the widths of the corresponding two slit openings (e.g., the slit openings 116a and 116b), as long as this sum is not greater than the maximum allowable width of the first trace layer 214a. In other words, since the multilayer-type on-chip inductor structure 30 can also use the slit openings 116a, 116b, 118a, 118b, 120a, 120b, 122a, and 122b to increase the width of the first trace layer 214a (e.g., greater than the width W1 shown in FIG. 2), the cross section of the inductor can be further increased, thereby improving the Q value of the inductor further.

Moreover, unlike the multilayer-type on-chip inductor structure 20 in FIGS. 3 and 4A, the lower cross-connection layer 224 of the connecting layer pair 228 in the multilayer-type on-chip inductor structure 30 has two slit openings 225a and 225b with a side-by-side arrangement. In some embodiments, the slit openings 225a and 225b vertically pass through the lower cross-connection layer 224, and the slit opening 225b extends in the extending direction of the length of the slit opening 225a, as shown in FIG. 5. Moreover, the slit opening 225a is aligned to and connected to the slit opening 116a in the second trace layer 107a of the first semi-circular stacking layer 216 and the slit opening 122a in second trace layer 107a of second semi-circular stacking layer 222. In addition, the slit opening 225b is aligned to and connected to the slit opening 116b in second trace layer 107a of first semi-circular stacking layer 216 and the slit opening 122b in second trace layer 107a of second semi-circular stacking layer 222.

In other embodiments (not shown), in the multilayer-type on-chip inductor structure 30, the inner edge 251 of the first trace layer 214a is not aligned to the inner edge 151 of the second trace layer 107a, and the outer edge 252 of the first trace layer 214a is also not aligned to the outer edge 152 of the second trace layer 107a, as previously described.

Figure 7:
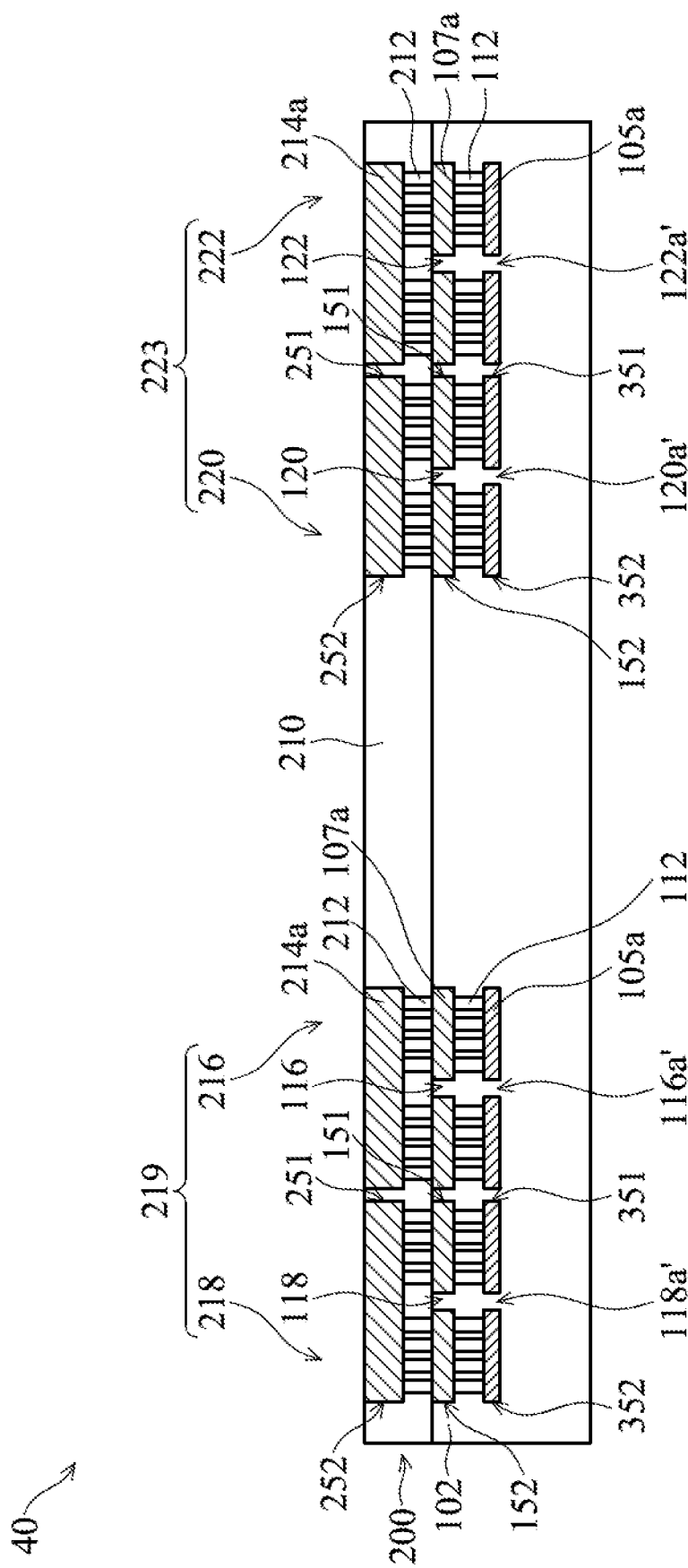
FIG. 7 is a cross section of a multilayer-type on-chip inductor structure in accordance with some embodiments.

Refer to FIG. 7, which illustrates a cross section of a multilayer-type on-chip inductor structure 40 in accordance with some embodiments. Elements in FIG. 7 that are the same as those in FIG. 4A are labeled with the same reference numbers as in FIG. 4A and are not described again. The multilayer-type on-chip inductor structure 40 has a structure that is similar to that of the multilayer-type on-chip inductor structure 20 shown in FIG. 4A.

However, unlike the multilayer-type on-chip inductor structure 20 shown in FIG. 4A, in the multilayer-type on-chip inductor structure 40, the first semi-circular stacking layer 216, the second semi-circular stacking layer 218, the first semi-circular stacking layer 220, and the second semi-circular stacking layer 222 each further includes a third trace layer 105a. Compared to the thickness of the first trace layer 214a and the second trace layer 107a, the thickness of the third trace layer 105a is thinner in the design rule. In other embodiments (not shown), the thickness of the second trace layer 107a is the same as the thickness of the third trace layer 105a.

In some embodiments, the third trace layer 105*a* is disposed in the inter-metal dielectric layer 102 and correspondingly formed below the second trace layer 107*a*. More specifically, the third trace layer 105*a* of the first semi-circular stacking layer 216 has a slit opening 116*a*' correspondingly formed below the slit opening 116. Also, the third trace layer 105*a* of the second semi-circular stacking layer 218 has a slit opening 118*a*' correspondingly formed below the slit opening 118. The third trace layer 105*a* of the first semi-circular stacking layer 220 has a slit opening 120*a*' correspondingly formed below the slit opening 120. The third trace layer 105*a* of the second semi-circular stacking layer 222 has a slit opening 122*a*' correspondingly formed below the slit opening 122. In some embodiments, these slit openings 116*a*', 118*a*', 120*a*', and 122*a*' vertically pass through the corresponding third trace layer 105*a* and extend in the extending direction of the length of the third trace layer 105*a*.

In some embodiments, the structure and shape of the third trace layer 105*a* of the first semi-circular stacking layer 216 is the same as those of the overlying second trace layer 107*a*, as shown in FIG. 7. In those cases, the multilayer-type on-chip inductor structure 40 further includes conductive plugs 112 disposed between the second trace layer 107*a* and the third trace layer 105*a*. In the first semi-circular stacking layers 216 and 220 and the second semi-circular stacking layers 218 and 222, the second trace layer 107*a* is electrically connected to the corresponding third trace layer 105*a* via the conductive plugs 112.

Similarly, each third trace layer 105*a* in the first semi-circular stacking layers 216 and 120 and in the second semi-circular stacking layers 118 and 122 has an inner edge 351 and an outer edge 352. In some embodiments, the inner edge 251 of the first trace layer 214*a* is substantially aligned to the inner edge 151 of the second trace layer 107*a* and the inner edge 351 of the third trace layer 105*a*. Moreover, the outer edge 252 of the first trace layer 214*a* is substantially aligned to the outer edge 152 of the second trace layer 107*a* and the outer edge 352 of the third trace layer 105*a*.

In some other embodiments (not shown), the inner edge 251 of the first trace layer 214*a* is not aligned to the inner edge 151 of the second trace layer 107*a* and/or the inner edge 351 of the third trace layer 105*a*. Moreover, the outer edge 252 of the first trace layer 214*a* is also not aligned to the outer edge 152 of the second trace layer 107*a* and/or the outer edge 352 of the third trace layer 105*a*.

Compared to the multilayer-type on-chip inductor structure 20 shown in FIGS. 3 and 4A, the multilayer-type on-chip inductor structure 40 can further increase the cross section of the inductor via the third trace layer 105*a*, thereby improving the Q value of the inductor further.

Figure 8:
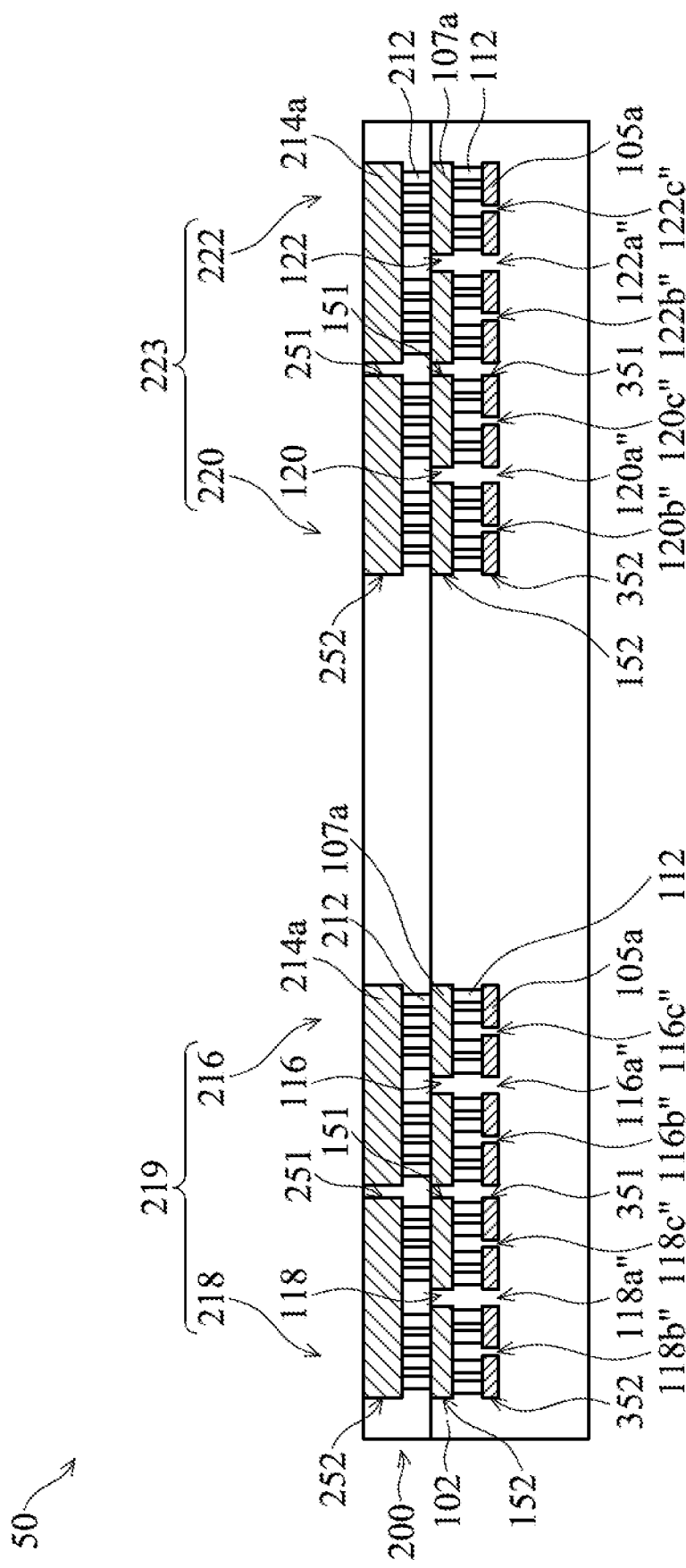
FIG. 8 is a cross section of a multilayer-type on-chip inductor structure in accordance with some embodiments.

FIG. 8 illustrates a cross section of a multilayer-type on-chip inductor structure 50 in accordance with some embodiments. Elements in FIG. 8 that are the same as those in FIG. 7 are labeled with the same reference numbers as in FIG. 7 and are not described again. The multilayer-type on-chip inductor structure 50 has a structure that is similar to that of the multilayer-type on-chip inductor structure 40 shown in FIG. 7. Unlike the multilayer-type on-chip inductor structure 40 shown in FIG. 7, the third trace layer 105*a* in the multilayer-type on-chip inductor structure 50 has three slit openings with a side-by-side arrangement. In some embodiments, these slit openings vertically pass through the corresponding third trace layer 105*a* and extend in the extending direction of the length of the corresponding third trace layer 105*a*.

More specifically, the third trace layer 105*a* of the first semi-circular stacking layer 216 has three slit openings 116*a*", 116*b*", and 116*c*" with a side-by-side arrangement. The slit opening 116*a*" is correspondingly formed below the slit opening 116 and between the slit opening 116*b*" and the slit opening 116*c*". Moreover, the slit opening 116*b*" and the slit opening 116*c*" extend in the extending direction of the length of the slit opening 116*a*".

Similarly, the third trace layer 105*a* of the second semi-circular stacking layer 218 has three slit openings 118*a*", 118*b*", and 118*c*" with a side-by-side arrangement. The slit opening 118*a*" is correspondingly formed below the slit opening 118 and between the slit opening 118*b*" and the slit opening 118*c*". The third trace layer 105*a* of the first semi-circular stacking layer 220 has three slit openings 120*a*", 120*b*", and 120*c*" with a side-by-side arrangement. The slit opening 120*a*" is correspondingly formed below the slit opening 120 and between the slit opening 120*b*" and the slit opening 120*c*". The slit opening 122*a*" is correspondingly formed below the slit opening 122 and between the slit opening 122*b*" and the slit opening 122*c*".

Compared with the multilayer-type on-chip inductor structure 20 shown in FIGS. 3 and 4A, the multilayer-type on-chip inductor structure 50 can also further increase the cross section of the inductor via the third trace layer 105*a*, thereby improving the Q value of the inductor further.

Figure 9:
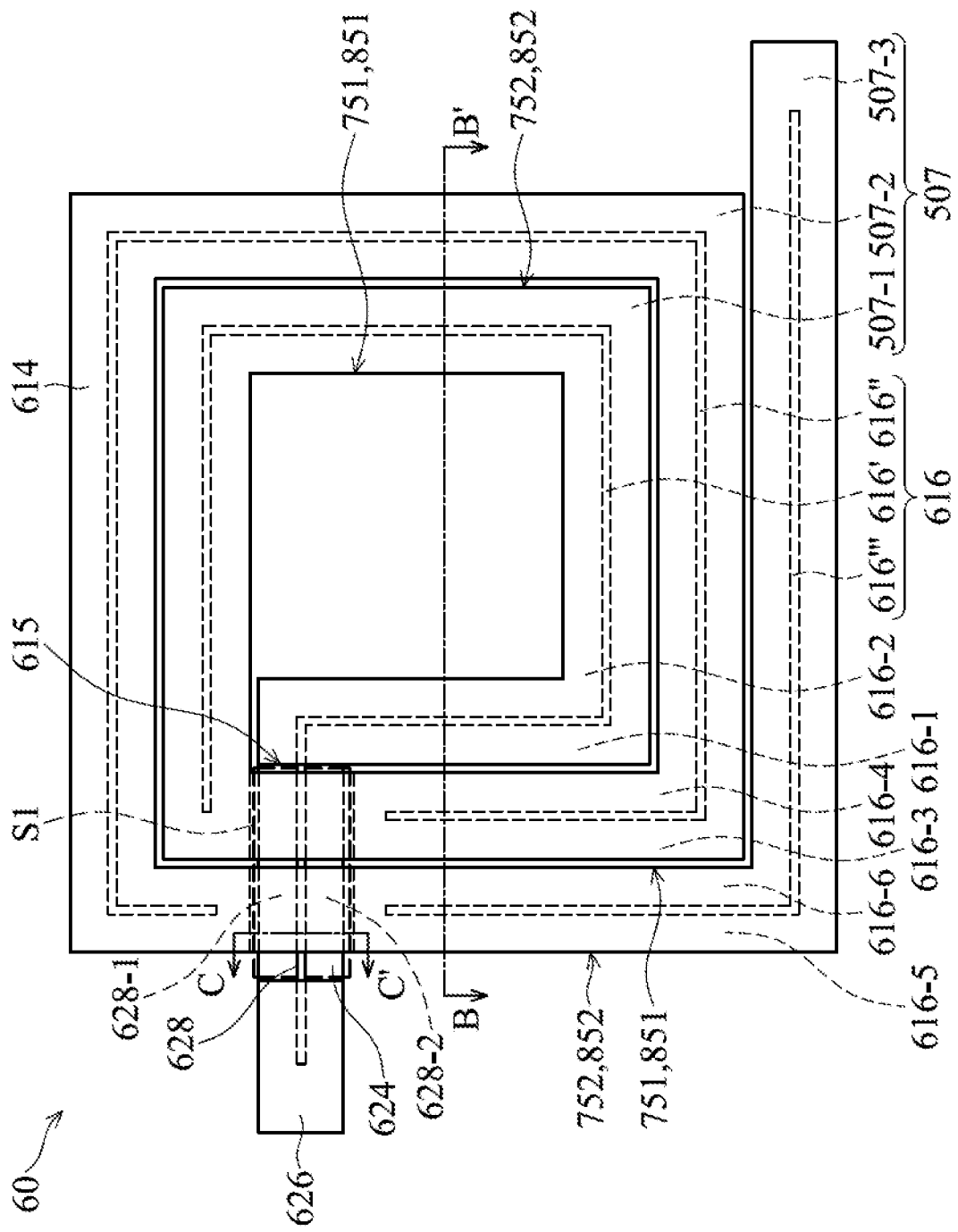
FIG. 9 is a plan view of a multilayer-type on-chip inductor structure in accordance with some embodiments.
Figure 10A:
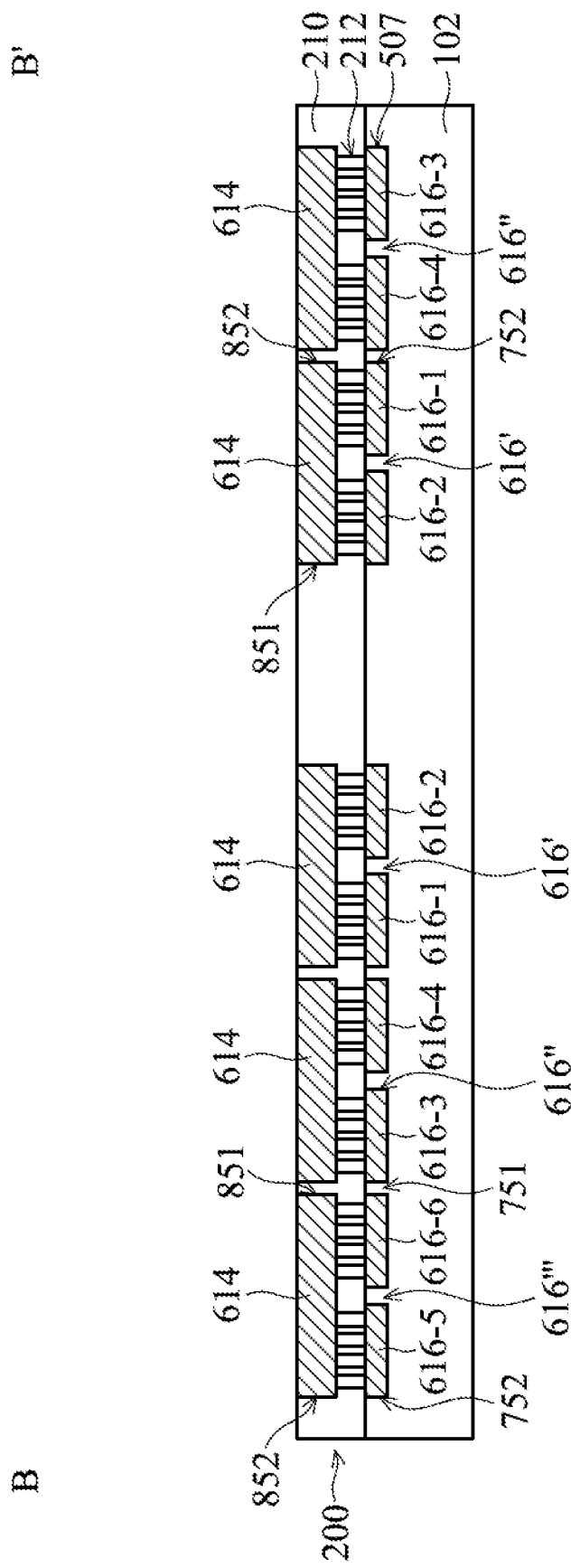
FIG. 10A shows a cross section along B-B' line shown in FIG. 9 in accordance with some embodiments.
Figure 10B:
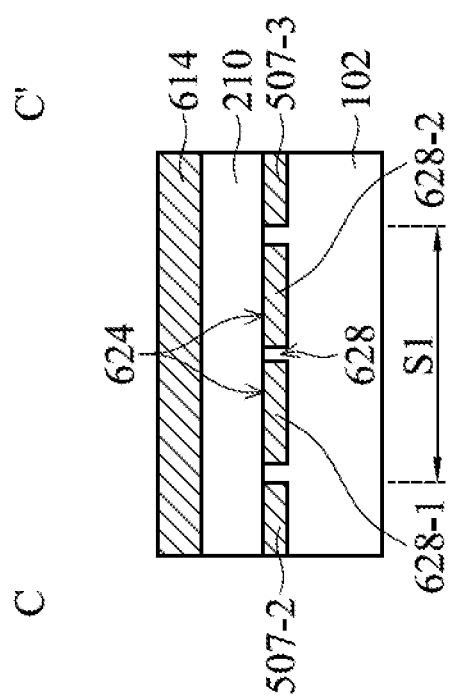
FIG. 10B shows a cross section along C-C' line shown in FIG. 9 in accordance with some embodiments.

Refer to FIGS. 9, 10A and 10B, in which FIG. 9 is a plan view of a multilayer-type on-chip inductor structure 60 in accordance with some embodiments, FIG. 10A shows a cross section along B-B' line shown in FIG. 9 in accordance with some embodiments, and FIG. 10B shows a cross section along C-C' line shown in FIG. 9 in accordance with some embodiments. Elements in FIGS. 9, 10A and 10B that are the same as those in FIGS. 1 and 2 are labeled with the same reference numbers as in FIGS. 1 and 2 and are not described again.

Unlike the multilayer-type on-chip inductor structure 10 in FIGS. 1 and 2, the multilayer-type on-chip inductor structure 60 is implemented as a spiral inductor structure. In some embodiments, the multilayer-type on-chip inductor structure 60 includes: an inter-metal dielectric layer 102, an insulating redistribution layer 210 disposed on the inter-metal dielectric layer 102, a second spiral trace layer 507 disposed in the inter-metal dielectric layer 102, and a first spiral trace layer 614 disposed in the insulating redistribution layer 210. Moreover, conductive plugs 212 are disposed between the first spiral trace layer 614 and the second spiral trace layer 507, so that the first spiral trace layer 614 is electrically connected to the second spiral trace layer 507. In some embodiments, the first spiral trace layer 614 and the second spiral trace layer 507 substantially form a circular, rectangular, hexagonal, octagonal, or polygonal shape. To simplify the diagram, only an exemplary rectangular shape is depicted.

In some embodiments, the first spiral trace layer 614 and the redistribution layer 214 (as shown in FIG. 2) are located at the same level in the insulating redistribution layer 210. For example, the first spiral trace layer 614 and the redistribution layer 214 may be defined by the same uppermost metal layer in the redistribution structure 200. Moreover, the second spiral trace layer 507 is correspondingly formed below the first spiral trace layer 614. The second spiral trace layer 507 and the wiring layer 107 (as shown in FIG. 2) are located at the same level in the inter-metal dielectric layer 102. For example, the second spiral trace layer 507 and the wiring layer 107 may be defined by the same uppermost metal layer in the interconnect structure.

In some embodiments, the inter-metal dielectric layer 102 has a separating region S1. The separating region S1 divides the second spiral trace layer 507 into multiple portions along a direction. For example, the multilayer-type on-chip inductor structure 60 may be a 3-turn spiral inductor structure with the separating region S1 adjacent to an end portion 615 of the innermost turn of the second spiral trace layer 507, as shown in FIG. 9. Moreover, the separating region S1 divides the second spiral trace layer 507 into three approximately circular line segments 507-1, 507-2, and 507-3. For example, the second spiral trace layer 507 shown in the C-C' line of FIG. 9 is interrupted by the separating region S1 to form line segments 507-2 and 507-3 on both sides of the separating region S1, as shown in FIG. 10B. It is understood that the separating region S1 near the end portion 615 of the innermost turn of the second spiral trace layer 507 is also formed between the line segments 507-1 and 507-2.

Moreover, similar to the slit opening 116, 118, 120, or 122 of the multilayer-type on-chip inductor structure 20 shown in FIGS. 3 and 4A, the slit openings (e.g., the slit openings 616', 616", and 616') vertically pass through the second spiral trace layer 507. For example, the slit openings 616', 616", and 616' correspondingly formed in the approximately circular line segments 507-1, 507-2, and 507-3. In some embodiments, the approximately circular line segment 507-1 forms two separated line portions 616-1 and 616-2 due to the slit opening 616'. Similarly, the approximately circular line segment 507-2 forms two separated line portions 616-3 and 616-4 due to the slit opening 616", and the approximately circular line segment 507-3 forms two separated line portions 616-5 and 616-6 due to the slit opening 616'. As a result, similar to the multilayer-type on-chip inductor structure 20 shown in FIGS. 3 and 4A, the multilayer-type on-chip inductor structure 60 can further improve the Q value of the inductor by the formation of these slit openings 616', 616", and 616'.

In some embodiments, a first spiral trace layer 614 has an inner edge 851 and an outer edge 852, and the second spiral trace layer 507 (including the line segments 507-1, 507-2, and 507-3) also has an inner edge 751 and an outer edge 752. Moreover, the inner edge 851 of the first spiral trace layer 614 is substantially aligned to the inner edge 751 of the second spiral trace layer 507. The outer edge 852 of layer 614a is substantially aligned to the outer edge 752 of the second spiral trace layer 507.

In some embodiments, the multilayer-type on-chip inductor structure 60 further includes a lower connecting layer 624 and an upper connecting layer 626 disposed in the inter-metal dielectric layer 102 and the insulating redistribution layer 210, respectively. In some embodiments, the lower connecting layer 624 and the second spiral trace layer 507 are located at the same level in the inter-metal dielectric layer 102. In some embodiments, the upper connecting layer 626 and the first spiral trace layer 614 are located at the same level in the insulating redistribution layer 210. That is, the lower connecting layer 624 may be defined by the uppermost metal layer in the interconnect structure, and the upper connecting layer 626 may be defined by the uppermost metal layer in the redistribution structure 200.

In some embodiments, the lower connecting layer 624 is disposed in the separating region S1 and extends to the end portion 615 of the innermost turn of the second spiral trace layer 507. Similar to the slit openings 616', 616", and 616''' in the line segments 507-1, 507-2, and 507-3, a slit opening 628 vertically passes through the lower connecting layer 624 and extends in the extending direction of the length of the lower connecting layer 624. Similarly, the lower connecting layer 624 forms two separated line portions 628-1 and 628-2 due to the slit opening 628. In addition, the two line portions 628-1 and 628-2 located at the separating region S1 are formed between the line segments 507-1 and 507-2 that are separated by the separating region S1. The two line portions 628-1 and 628-2 located at the separating region S1 are formed between the line segments 507-2 and 507-3 that are separated by the separating region S1. In some embodiments, the slit opening 628 extends into the line segment 507-1 and connects the slit opening 616'. In some embodiments, the upper connecting layer 626 is disposed in insulating redistribution layer 210 above the lower connecting layer 624 and can be electrically connected to the lower connecting layer 624 by conductive plugs (not shown).

Figure 11:
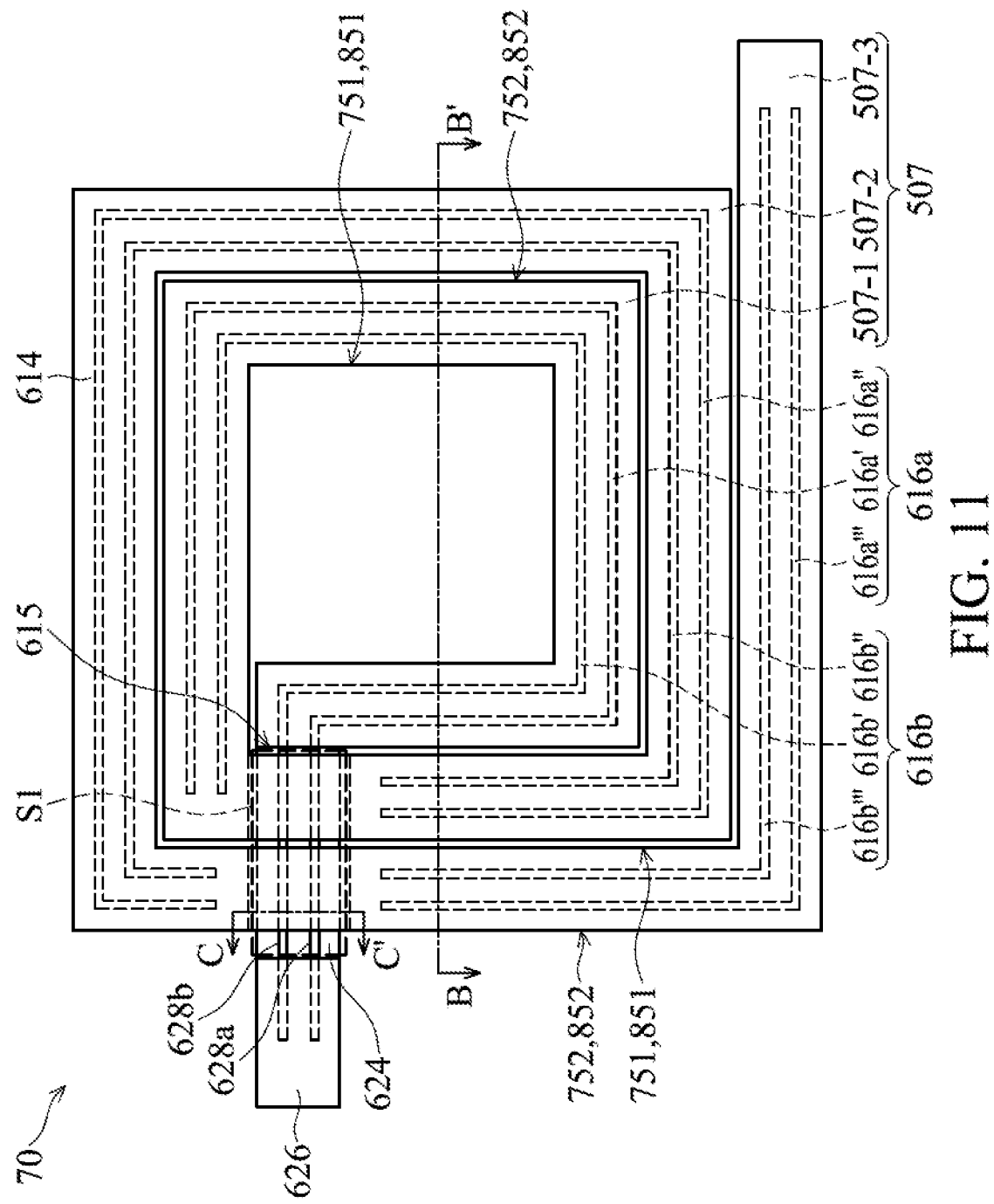
FIG. 11 is a plan view of a multilayer-type on-chip inductor structure in accordance with some embodiments.

Refer to FIG. 11, which illustrates a plan view of a multilayer-type on-chip inductor structure 70 according to some embodiments. Elements in FIG. 11 that are the same as those in FIG. 9 are labeled with the same reference numbers as in FIG. 9 and are not described again. The multilayer-type on-chip inductor structure 70 has a structure that is similar to that of the multilayer-type on-chip inductor structure 60 shown in FIG. 9.

However, unlike the multilayer-type on-chip inductor structure 60 shown in FIG. 9, the approximately circular line segments 507-1, 507-2, and 507-3 of the second spiral trace layer 507 of the multilayer-type on-chip inductor structure 70 has more than one slit openings with a side-by-side arrangement. In some embodiments, the approximately circular line segment 507-1 has two slit openings 616a' and 616b' with a side-by-side arrangement. Moreover, the approximately circular line segment 507-2 has two slit openings 616a" and 616b" with a side-by-side arrangement, and the approximately circular line segment 507-3 has two slit openings 616a''' and 616b'' with a side-by-side arrangement. These slit openings 616a', 616b', 616a", 616b", 616a''' and 616b''' vertically pass through the line segments 507-1, 507-2, and 507-3 of the second spiral trace layer 507. The slit opening 616b' extends in the extending direction of the length of the slit opening 616a'. Similarly, the slit opening 616b" extends in the extending direction of the length of the slit opening 616a", and the slit opening 616b' extends in the extending direction of the length of the slit opening 616a'. The line segment 507-1 has three line portions separated from each other due to the slit openings 616a' and 616b'. Also, the line segments 507-2 and 507-3 also have three line portions separated from each other. As a result, similar to the multilayer-type on-chip inductor structure 60 shown in FIG. 9, the multilayer-type on-chip inductor structure 70 can further improve the Q value of the inductor by the formation of these slit openings 616a', 616b', 616a", 616b", 616a''' and 616b'''.

In some embodiments, the lower connecting layer 624 has two slit openings 628a and 628b with a side-by-side arrangement. The slit openings 628a and 628b vertically pass through the lower connecting layer 624. The slit opening 628a extends in the extending direction of the length of the lower connecting layer 624, and the slit opening 628b extends in the extending direction of the length of the slit opening 628a. Similarly, the lower connecting layer 624 has three line portions separated from each other due to the slit openings 628a and 628b. In some embodiments, the slit openings 628a and 628b extend into the line segment 507-1 and are connected to the slit opening 616a' and 616b'.

In other embodiments (not shown), the inner edge 851 of the first spiral trace layer 614 in the multilayer-type on-chip inductor structure 70 is substantially aligned to the inner edge 751 of the second spiral trace layer 507. Moreover, the outer edge 252 of the first spiral trace layer 614a is substantially aligned to the outer edge 752 of the second spiral trace layer 507, as previously described.

In addition, in some embodiments, similar to the embodiments of FIGS. 7 and 8, the multilayer-type on-chip inductor structures 60 and 70 in the embodiments of FIGS. 9 and 11 can also have an arrangement with a third spiral trace layer (not shown). This third spiral trace layer is arranged below the second spiral trace layer 507 and electrically connected to multiple conductive plugs. The third spiral trace layer and the wiring layer 105 shown in FIG. 2 are located at the same level in the inter-metal dielectric layer 102. In an embodiment, the third spiral trace layer can be correspondingly arranged below the line portions 616-1 to 616-6 and electrically connected thereto by the conductive plugs. In another embodiment, the third spiral trace layer is correspondingly arranged below the line portion 616-1 to 616-6 and electrically connected with a conductive plug. In another embodiment, the third spiral trace layer can be arranged similar to FIG. 8, so that the third spiral trace layer has line portions (not shown) separated by the slit openings and below the respective line portions 616-1 to 616-6. These line portions are electrically connected to the corresponding line portions 616-1 to 616-6 by conductive plugs.

According to the multilayer-type on-chip inductor structures of the embodiments, since the uppermost metal layer of the redistribution structure is used as the first trace layer/first spiral trace layer of the inductor, and the uppermost metal layer of the inter-metal dielectric layer is used as the second trace layer/second spiral trace layer of the inductor, the cross section of the inductor can be effectively increased, thereby improving the Q value of the inductor further. In addition, since the multilayer-type on-chip inductor structure can be formed during the fabrication of the interconnect structure and the redistribution structure, there is no need to use additional metal layers and additional processes for the fabrication of the multilayer-type on-chip inductor structure. As a result, the manufacturing cost is not increased.

According to the multilayer-type on-chip inductor structures of the embodiments, since the second trace layer/second spiral trace layer in the inductor has one or more slit openings, the effective width of the first trace layer/first spiral trace layer (the sum of the widths of the multiple line segments and the widths of the corresponding slit openings) is greater than the maximum allowable width of the design rule of the interconnect structure. It allows that the width of the first trace layer/first spiral trace layer is increased. As a result, the cross section of the inductor can be increased further.

In addition, according to the multilayer-type on-chip inductor structures of the embodiments, since there is a third trace layer having a structure or configuration the same as or similar to that of the second trace layer and electrically connected thereto, the cross section of the inductor can be increased further.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A multilayer-type on-chip inductor structure, comprising:
    an insulating redistribution layer disposed on an inter-metal dielectric layer;
    a first spiral trace layer disposed in the insulating redistribution layer; and
    a second spiral trace layer disposed in the inter-metal dielectric layer and correspondingly formed below the first spiral trace layer, wherein the inter-metal dielectric layer has a separating region to divide the second spiral trace layer into a plurality of line segments, and wherein each of a plurality of first slit openings and each of a plurality of second slit openings pass through a corresponding line segment, and extend in an extending direction of a length of the corresponding line segment.

2. The structure as claimed in claim 1, further comprising:
    a plurality of conductive plugs disposed between the first spiral trace layer and the second spiral trace layer, so that the first spiral trace layer is electrically connected to the second spiral trace layer.

3. The structure as claimed in claim 1, wherein the separating region is adjacent to an end portion of an innermost turn of the second spiral trace layer.

4. The structure as claimed in claim 1, further comprising:
    a lower connecting layer disposed in the separating region and extending to an end portion of an innermost turn of the second spiral trace layer, wherein a third slit opening passes through the lower connecting layer and extends in an extending direction of a length of the lower connecting layer.

5. The structure as claimed in claim 4, further comprising:
    an upper connecting layer disposed in the insulating redistribution layer above the lower connecting layer and electrically connected to the lower connecting layer.

6. The structure as claimed in claim 4, wherein the third slit opening is connected to one of the plurality of first slit openings.

7. The structure as claimed in claim 4, further comprising:
    a fourth slit opening passes through the lower connecting layer and extends in an extending direction of a length of the third slit opening.

8. The structure as claimed in claim 7, wherein the fourth slit opening is connected to one of the plurality of second slit openings.

9. The structure as claimed in claim 1, wherein the first spiral trace layer and the second spiral trace layer each has an inner edge and an outer edge, and wherein the inner edge of the first spiral trace layer is substantially aligned to the inner edge of the second spiral trace layer, and the outer edge of the first spiral trace layer is substantially aligned to the outer edge of the second spiral trace layer.

10. The structure as claimed in claim 1, wherein the thickness of the first spiral trace layer is greater than the thickness of the second spiral trace layer.

* * * * *